(12) United States Patent
Smith et al.

(10) Patent No.: US 7,209,527 B2
(45) Date of Patent: Apr. 24, 2007

(54) **TURBO DECODER EMPLOYING MAX AND MAX* MAP DECODING**

(75) Inventors: William H. Smith, Bethelehem, PA (US); Koji O. Tanaka, Gilbertsville, PA (US); Shuzhan Xu, Coplay, PA (US)

(73) Assignee: Agere Systems Inc., Allentown, PA (US)

( * ) Notice: Subject to any disclaimer, the term of this patent is extended or adjusted under 35 U.S.C. 154(b) by 779 days.

(21) Appl. No.: 10/190,972

(22) Filed: Jul. 8, 2002

(65) Prior Publication Data

US 2004/0005019 A1 Jan. 8, 2004

(51) Int. Cl.
*H04L 27/06* (2006.01)
(52) U.S. Cl. ..................... 375/341; 714/755
(58) Field of Classification Search ............... 375/341, 375/340, 262, 265; 714/755, 786, 792, 794, 714/795, 787, 788
See application file for complete search history.

(56) References Cited

U.S. PATENT DOCUMENTS

| | | | |
|---|---|---|---|
| 6,392,572 B1* | 5/2002 | Shiu et al. | 341/81 |
| 6,393,076 B1* | 5/2002 | Dinc et al. | 375/341 |
| 6,510,536 B1* | 1/2003 | Crozier et al. | 714/755 |
| 6,725,409 B1* | 4/2004 | Wolf | 714/755 |
| 6,795,512 B1* | 9/2004 | Eidson et al. | 375/341 |
| 6,898,254 B2* | 5/2005 | Wolf et al. | 375/340 |

* cited by examiner

*Primary Examiner*—Tesfaldet Bocure
*Assistant Examiner*—Jaison Joseph

(57) ABSTRACT

A turbo decoder employs max* term or max term maximum a priori (MAP) decoding of received, encoded data. Initially, MAP decoding is iterative and employs max* term computation of log-likelihood values at each iteration. Max* term computation includes computation of a max term and a logarithmic correction term. A bypass algorithm switches from max* term computation to only max term computation in later iterations with little or no degradation in decoder performance. The iteration selected for switching may be based on increasing intrinsic signal-to-noise ratio (SNR) of the iterative MAP decoding. Since, in general, fewer computations are required for max term computation than for max* term computation, switching between max* and max allows for reduced power consumption of a particular decoder implementation.

27 Claims, 5 Drawing Sheets

US 7,209,527 B2

TURBO DECODER EMPLOYING MAX AND MAX* MAP DECODING

BACKGROUND OF THE INVENTION

1. Field of the Invention

The present invention relates to decoding of encoded and transmitted data in a communication system, and, more particularly, to maximum a priori (MAP) decoding algorithms.

2. Description of the Related Art

MAP algorithms are employed for processing a channel output signal applied to a receiver. MAP algorithms may be used for both detection (to reconstruct estimates for transmitted symbols) and decoding (to reconstruct user data). A MAP algorithm provides a maximum a posteriori estimate of a state sequence of a finite-state, discrete-time Markov process observed in noise. A MAP algorithm forms a trellis corresponding to possible states (portion of received symbols or data in the sequence) for each received output channel sample per unit increment in time (e.g., clock cycle).

A trellis diagram may represent states, and transitions between states, of the Markov process spanning an interval of time. The number of bits that a state represents is equivalent to the memory of the Markov process. Thus, probabilities (sometimes of the form of log-likelihood ratio (LLR) values) are associated with each transition within the trellis, and probabilities are also associated with each decision for a sample in the sequence. These LLR values are also referred to as reliability information.

A processor implementing a MAP algorithm computes LLR values using $\alpha$ values (forward state probabilities for states in the trellis and also known as a forward recursion) and, $\beta$ values (reverse state probabilities in the trellis and also known as a backward recursion), as described subsequently. The $\alpha$ values are associated with states within the trellis, and these $\alpha$ values are stored in memory. The processor using a MAP algorithm computes values of $\beta$, and the $\alpha$ values are then retrieved from memory to compute the final output LLR values.

The variable S is defined as the possible state (from a set of possible states $\{s_p\}_{p=0}^{M-1}$) of the Markov process at time i, y, is defined as the noisy channel output sample at time i, the sample sequence $y^K$ is defined as the sequence of length K of noisy channel output samples $$\{y_i\}_{i=0}^{K-1},$$

and $y_i^K$ is the noisy channel output sample $y_i$ at time i in a given sequence $y^K$ of length K. For a data block of length K, probability functions at time i may be defined for the Markov process as given in equations (1) through (3):

$$\alpha_s^i = p(S = s; y_i^K) \quad (1)$$

$$\beta_s^i = p(y_{i+1}^K \mid S = s) \quad (2)$$

$$\gamma_{s',s}^i = p(S = s; y_i^K \mid S' = s'). \quad (3)$$

where S is the Markov process variable at time i, S' is the Markov process variable at time i−1, s is the observed state of S of the Markov process at time i, and s' is the observed state of S' of the Markov process at time i−1.

The log-likelihood ratio (LLR) value $L(u_i)$ for a user's symbol $u_i$ at time i may then be calculated as given in equation (4):

$$L(u_i) = \log\left(\frac{p(u_i = +1 \mid y_i^K)}{p(u_i = -1 \mid y_i^K)}\right). \quad (4)$$

Defining $\alpha_l^i$ and $\beta_l^i$ from equations (1) and (2) as the forward and backward recursions (probabilities or state metrics) at time i in state s=l, respectively, and defining $$\gamma_{m,l}^i$$

as the branch metric associated with the transition from state m at time i−1 to state l at time i, then the forward recursion for states is given in equation (5):

$$\alpha_l^i = \sum_{l \in S} \alpha_l^{i-1} \gamma_{m,l}^i, \quad (5)$$

where l∈S is a set of states at time i−1 which have a valid transition to the state l at time i.

Similarly, the backward recursion for states is given in equation (6):

$$\beta_l^{i-1} = \sum_{m \in S} \beta_m^i \gamma_{l,m}^i, \quad (6)$$

where m∈S is a set of states at time i which have a valid transition from the state l to the state m at time i−1.

Once the forward and backward recursions for states are calculated, equation (4) is employed to generate the log-likelihood value (also known as reliability value) $L(u_i)$ for each user symbol $u_i$. Thus, equation (4) may be re-written as given in equation (7):

$$L(u_i) = \log\left(\frac{\sum_{(l,m)\in S^+} \alpha_l^{i-1} \gamma_{l,m}^i \beta_l^i}{\sum_{(l,m)\in S^-} \alpha_l^{i-1} \gamma_{l,m}^i \beta_m^i}\right) \quad (7)$$

where a state pair (l, m)∈S⁺ is defined as a pair that has a transition from state l at time i−1 to state m at time i corresponding to the user symbol $u_i$="1", and a state pair (l, m)∈S⁻ is similarly defined as a pair that has a transition from state l at time i−1 to state m at time i corresponding to the user symbol $u_i$="−1".

A MAP algorithm may be defined by substituting $A_m^1 = \ln(\alpha_m^1)$, $B_m^1 = \ln(\beta_m^1)$, and $$\Gamma_{l,m}^i = \ln(\gamma_{l,m}^i)$$

into the equations (5), (6), and (7). Such substitution is sometimes referred to as the log-MAP algorithm. Also, with the relation that $\ln(e^{-x}+e^{-y})$ is equivalent to $\max(x,y) + \ln(e^{-|x-y|}+1)$, the forward and backward recursions of the log MAP algorithm may be described as in equations (8) and (9):

$$A_m^i = \max_{l \in S} * (A_l^{i-1} + \Gamma_{l,m}^i) \quad (8)$$

$$B_l^{i-1} = \max_{m \in S} * (B_m^{i-1} + \Gamma_{l,m}^i) \quad (9)$$

where max* (x, y) is defined as $\max(x, y) + \ln((e^{-|x-y|})+1)$. Note that equations (8) and (9) may include more than two terms in the max*( ) operator, so a max*(x, y, . . . , z) operation may be performed as a series of pairs of max*(•,•) calculations. Max(x, y) is defined as the "max term" and $\ln((e^{-|x-y|})+1)$ is defined as the "logarithmic correction term."

SUMMARY OF THE INVENTION

In accordance with embodiments of the present invention, a turbo decoder employs max* term or max term maximum a priori (MAP) decoding of encoded data received from a channel. Initially, MAP decoding is iterative and employs max* term computation of log-likelihood values at each iteration. Max* term computation includes computation of a max term and a logarithmic correction term. A bypass algorithm switches from max* term computation to only max term computation in later iterations with little or no degradation in decoding performance. The iteration selected for switching is based on increasing intrinsic signal-to-noise ratio (SNR) of the iterative MAP decoding process. Since, in general, fewer computations are required for max term computation than for max* term computation, switching between max* and max allows for reduced power consumption of a particular decoder implementation.

In accordance with an exemplary embodiment of the present invention, a receiver iteratively decodes channel samples to generate decoded data by (a) applying at least one maximum a priori (MAP) decoding based on a max* term for one or more initial iterations of decoding, wherein the max* term comprises a max term and a logarithmic correction term; and (b) switching, for one or more subsequent iterations, to at least one MAP decoding based on a max term.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTION

In accordance with exemplary embodiments of the present invention, a receiver employs iterative decoding of a received, encoded signal. Iterative decoding employs a constituent maximum a priori (MAP) decoder for each constituent encoding of information of the encoded signal. Each MAP decoder employs a log-MAP algorithm for decoding the received, encoded signal. The log-MAP algorithm employs a max* term calculation for Log Likelihood Ratio (LLR) values based on updated forward recursive, reverse recursive, and branch metrics sequences. The max* term includes a max term and a logarithmic correction term. When iterations begin, the iterative decoder is in a first mode in which both the max term and logarithmic term are employed for calculation of LLR values. Eventually, an iteration of MAP decoding occurs in which the contribution of the logarithmic correction term has relatively negligible effect on decoding with respect to a predetermined threshold. At this iteration, the MAP decoder switches to a second mode in which only the max term is employed for calculation of LLR values.

Figure 1:
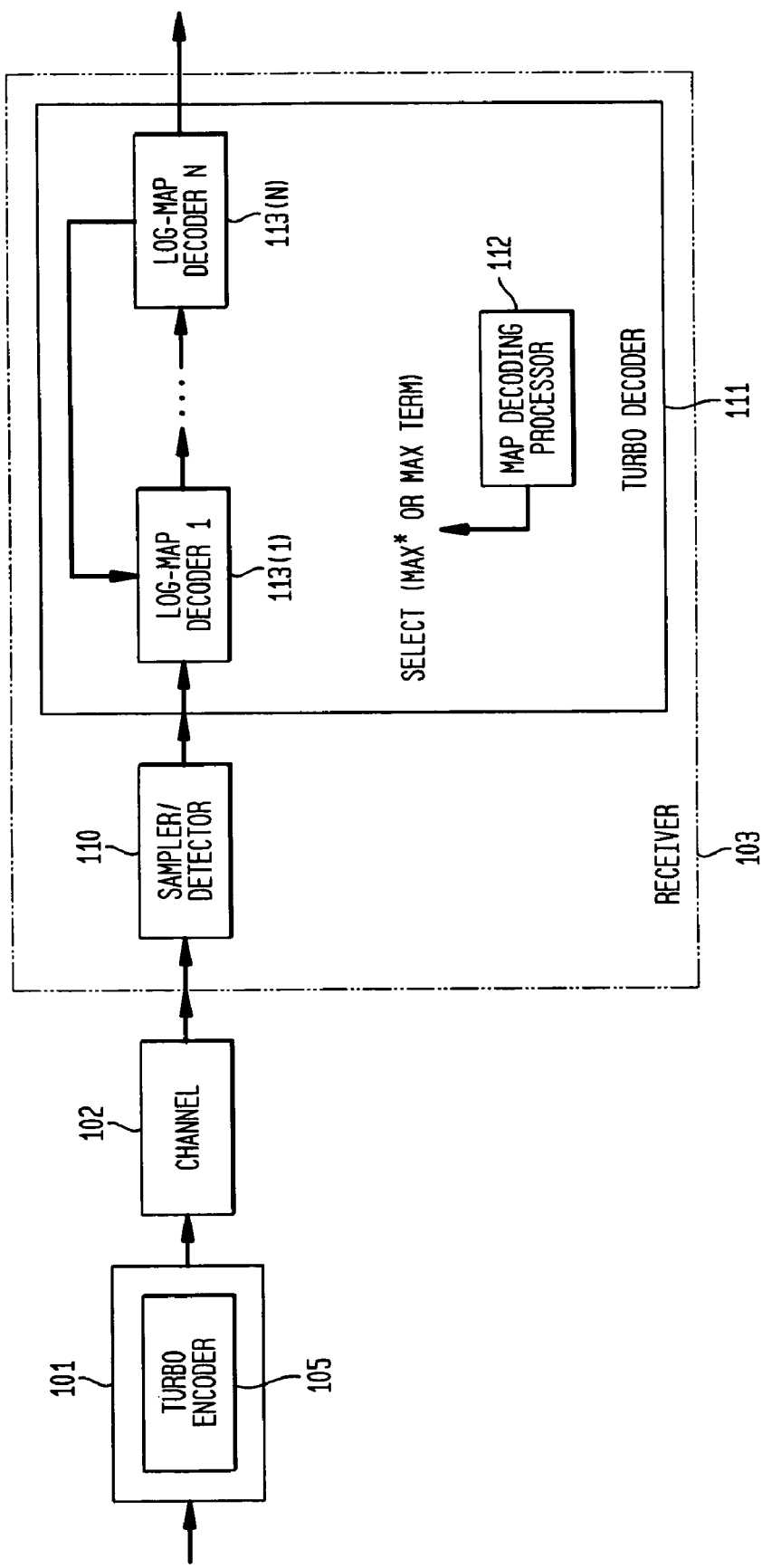
FIG. 1 shows a transmitter passing an encoded and modulated signal through a channel to a receiver employing iterative decoding in accordance with one or more embodiments of the present invention.

FIG. 1 shows transmitter 101 passing an encoded and modulated signal through channel 102 to receiver 103. Transmitter 101 includes systematic turbo encoder 105 performing parallel concatenation of two identical constituent convolutional encoders separated by an interleaver. Each constituent convolutional encoder employs a recursive systematic code (RSC). For example, the overall code rate of the turbo encoder may be ⅓ when the code rate for each constituent convolutional encoder is ½. For a block of length K, the sequence $$\{x_i = m_i\}_{i=0}^{K-1}$$

is defined as a sequence of information bits, and the sequences $$\{p_i\}_{i=0}^{K-1}$$

and $$\{p_i'\}_{i=0}^{K-1}$$

are defined as the parity bit sequences of the first and the second constituent encoders, respectively.

The information bits, or data, are encoded into a sequence of symbols $$(\text{denoted } \{u_i\}_{i=0}^{K-1})$$

and transmitted as a modulated signal through channel 102, such as a magnetic recording channel or wireless communication channel. While not shown explicitly in FIG. 1, transmitter 101 includes components and other systems well known in the art to modulate and transfer the signal to the channel.

Receiver 103 includes sampler/detector 110 and turbo decoder 111. Sampler/detector 110 samples and detects the signal received from channel 102 to generate output channel samples. While not shown explicitly in FIG. 1, receiver 103 includes components and other systems well known in the art to receive and demodulate the signal from the channel. Turbo encoder 111 employs a decoding algorithm operating in accordance with one or more embodiments of the present invention. Turbo decoder 111 employs a turbo decoding scheme based on one or more MAP decoding algorithms and is employed by receiver 103 to reconstruct the user information or data from the received output channel samples.

Turbo decoder 111 includes constituent (log-)MAP decoders 113(1)–113(N) and MAP decoding processor 112. Turbo decoder 111 employs iterative decoding, (i.e., repetitively decoding the sequence of output channel samples with two or more iterations) with each iteration comprising a series of constituent MAP decoding operations. Each constituent MAP decoding of an iteration corresponds to a constituent encoding of the transmitter 101. Each of MAP decoders 113(1)–113(N) applies the corresponding constituent MAP decoding operation.

Thus, during an iteration of decoding, the received sequence is deinterleaved and each constituent encoding is reversed. In turbo decoding, each constituent MAP decoding operation (of MAP decoders 113(1)–113(N)) generates soft decisions for received user bits and a set of LLR values corresponding to the soft decisions. Information generated by one constituent MAP decoding may be used by the next constituent MAP decoding operation. In accordance with the present invention, turbo decoder 111 includes MAP decoding processor 112, which generates a select signal to MAP decoders 113(1)–113(N). Based on the select signal, MAP decoders 113(1)–13(N) switch between max* term and max term calculation for LLR values during MAP decoding.

For an additive white Gaussian noise (AWGN) channel having noise (power) variance $$\sigma^2 = \frac{N_0}{2},$$

the observed output channel samples have the form of $$\{y_i\}_{i=0}^{K-1} = \{x_i\sqrt{E_s} + n_i\}_{i=0}^{K-1}, \{t_i\}_{i=0}^{K-1} = \{p_i\sqrt{E_s} + n_i'\}_{i=0}^{K-1}$$
$$\text{and } \{s_i'\}_{i=0}^{K-1} = \{p_i'\sqrt{E_s} + n_i''\}_{i=0}^{K-1}.$$

As is known in the art, decoding by each constituent MAP decoder generates the LLR value $L_i$ for time i from equation (7), which may be considered to have three components as given in equation (10):

$$L_i = \frac{2\sqrt{E_s}}{\sigma^2} y_i + z_i + l_i, \tag{10}$$

where $$\{L_i\}_{i=0}^{K-1}$$

is the sequence of LLR values for $$\{u_i\}_{i=0}^{K-1}.$$

In equation (10), the right hand term as a function of sample $y_i$ corresponds to the soft decision, $z_i$ is the input a priori extrinsic information from the previous constituent MAP decoding operation (which may be zero for the first iteration), and $$\{l_i\}_{i=0}^{K-1}$$

is the sequence of newly generated extrinsic information for the next constituent MAP decoding operation.

Repetitive MAP decoding exhibits increased coding gain, which may be related to an increase in intrinsic signal-to-noise ratio (SNR) with each iteration. The average intrinsic SNR per iteration (AverageSNR(iter)) for a block of length K is given in equation (11):

$$AverageSNR(iter) = StartSNR(0) + \frac{1}{2K\sqrt{E_s}} Q(iter, \{m_i\}, K) + \frac{\sigma^2}{4E_s}\left(\frac{1}{2K}\sum_{i=0}^{L-1} z_i^2\right), \tag{11}$$

where StartSNR(0) is the initial intrinsic SNR prior to the first iteration, and Q(iter, $\{m_i\}$, K) is a quality index defined as in equation (12):

$$Q(iter, \{m_i\}, K) = \sum_{i=0}^{K-1} m_i z_i, \tag{12}$$

where iter is the iteration number. These index values grow slowly over early iterations, grow very quickly during middle iterations, and eventually reach saturation at later iterations. In general, intrinsic SNR will increase with increasing iteration number due to the impact of extrinsic information.

As discussed with respect to equations (8) and (9), the calculation of LLR values may employ the max* term relationship of $\max^*(x,y) = \log(e^{-x} + e^{-y}) = \max(x, y) + \log(1 + e^{-|x-y|})$ Each constituent MAP decoder thus calculates the max* term by separate calculation of a max term (max(x,y)) and a logarithmic correction term $(\log(1+e^{-|x-y|}))$. The determination of the max term is easily implemented using a comparator, and the value for the logarithmic correction term may typically be generated via a look-up table.

For the example of a turbo encoder, the trellis of the MAP decoding algorithm is a two-state trellis (i.e., M=2 with $S_i = \{s_1, s_2\}$). For the two-state trellis in MAP decoding, the forward recursive sequence, backward recursive sequence and branch metric are denoted $\alpha(S_i)$, $\beta(S_i)$ and $\gamma(S_i^1, S_m)$, respectively, and for log-MAP decoding the forward recursive sequence, backward recursive sequence and branch metric are denoted $a(S_i) = \log\{\alpha(S_i)\}$, $b(S_i) = \log\{\beta(S_i)\}$, $c(S_i^1, S_m) = \log\{\gamma(S_i^1, S_m)\}$). Here, for $S_k^1$, the superscript j (e.g., j=1) of Markov process variable S indicates that the state of the variable is at time i–j, and the subscript k (e.g., k=l, m) indicates that the Markov process variable S is at observed state k.

Thus, for log-MAP decoding, the forward recursive sequence and backward recursive sequence are given in equations (14) and (15):

$$a(S_l) = \max^*\{[a(S_l^1) + c(S_l^1, S_l)], [a(S_l^2) + c(S_l^2, S_m)]\}, \quad (14)$$

$$b(S_l) = \max^*\{[b(S_l^1) + c(S_l, S_l^1)], [b(S_l^2) + c(S_m, S_l^2)]\}, \quad (15)$$

Equations (14) and (15) may be implemented with the well-known Add-Compare-Select (ACS) circuit incorporating a logarithmic correction term provided from memory. The LLR value $L_i$ at time i in accordance with the max* term of the log-MAP decoding algorithm may be computed as in equation (16):

$$L_i = \max^*_{u_i = +1}\{a(S_l^1) + c(S_l^1, S_l) + b(S_l)\} - \max^*_{u_i = +1}\{a(S_l^1) + c(S_l^1, S_l) + b(S_l)\}, \quad (16)$$

and, when the logarithmic correction term is dropped from equation (16), the max term of the log-MAP calculation for the LLR value at time i is given in equation (17):

$$L_i = \max^*_{u_i = +1}\{a(S_l^1) + c(S_l^1, S_l) + b(S_l)\} - \max^*_{u_i = +1}\{a(S_l^1) + c(S_l^1, S_l) + b(S_l)\}. \quad (17)$$

When the intrinsic SNR gets higher, the noise component $N_0$ correspondingly gets smaller. As shown in equation (18), the logarithmic correction term has asymptotic behavior when the limit of the term is taken as $N_o$ goes to zero:

$$\lim_{N_0 \to 0} \log\left(1 + e^{-\frac{4\sqrt{b_3}}{N_0}|x-y|}\right) = 0. \quad (18)$$

Figure 2:
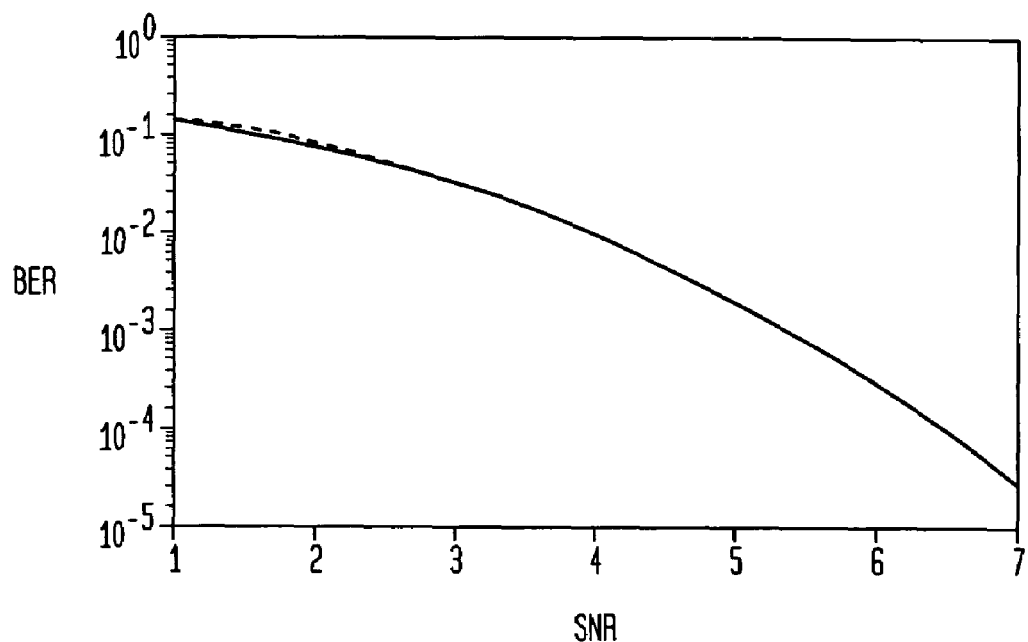
FIG. 2 shows performance of bit error rate (BER) versus signal-to-noise ratio (SNR) for max* term log-MAP decoding when compared to max term log-MAP decoding.

Thus, the max* term and max term are asymptotically equivalent for high SNR since the logarithmic correction term tends to zero at high SNR. FIG. 2 shows relative difference in performance of max* term log-MAP decoding when compared to max term log-MAP decoding. The relative difference is a comparison of bit error rate (BER) versus SNR. The comparison of FIG. 2 is based on simulation results for one decoding iteration with a UMTS W-CDMA recursive 8-state constituent MAP encoder under an AWGN channel conditions. As shown in FIG. 2, the performance difference decreases as SNR increases. The performance difference between max* term and max term based turbo decoding under AWGN channel also accumulates over many decoding iterations. Turbo decoder 111 of FIG. 1 may increase intrinsic SNR with increasing iteration number.

Increasing intrinsic SNR allows turbo decoder 111 to employ max* term computations at low intrinsic SNR for better decoding performance, and then to switch from max* term to max term computations at high intrinsic SNR to reduce processing operations of a given implementation. Since the number of computations required for max term computation is less than the number for max* term computation, switching to max term computation reduces the over all number of computations performed during iterative decoding. Fewer computations reduces the circuit activity factor of a given implementation, and, thus, reduces the overall power consumption of the implementation.

Formally, if Switch_ITER is a given iteration number, the turbo decoding algorithm (1) uses max* for constituent decoding for the first Switch_ITER iterations, then (2) uses max for each subsequent constituent decoding iteration. The switching point of Switch_ITER iterations may be selected based on simulation and calibration results. One skilled in the art would realize that the switching point may also be estimated in real-time with real-time channel measurements. For some embodiments of the present invention, provision may be made to switch back to max* term computation at subsequent iterations if certain performance criteria are not met.

Since computation of the correction term occurs at every state of the constituent MAP decoding algorithm trellis, switching between max* and max term computations may result in the following reduction in computations. If Max_ITER is the maximum iteration number and each constituent encoder (of transmitter 101) has 8 states, the total number of max* logarithmic correction computations for both forward recursion and backward recursion is given in equation (19):

$$8*L*\text{Max\_iter}, \quad (19)$$

when all iterations employ max* term computation. By switching to max term computation after Switch_ITER iterations, the number of logarithmic correction computations is reduced to that of equation (20):

$$8*L*\text{Switch\_iter}, \quad (20)$$

and the percentage of computational saving is as given in equation (21):

$$\frac{\text{Max\_ITER} - \text{Switch\_ITER}}{\text{Max\_ITER}}(100) = \left(1 - \frac{\text{Switch\_ITER}}{\text{Max\_ITER}}\right)(100), \quad (21)$$

Figure 3:
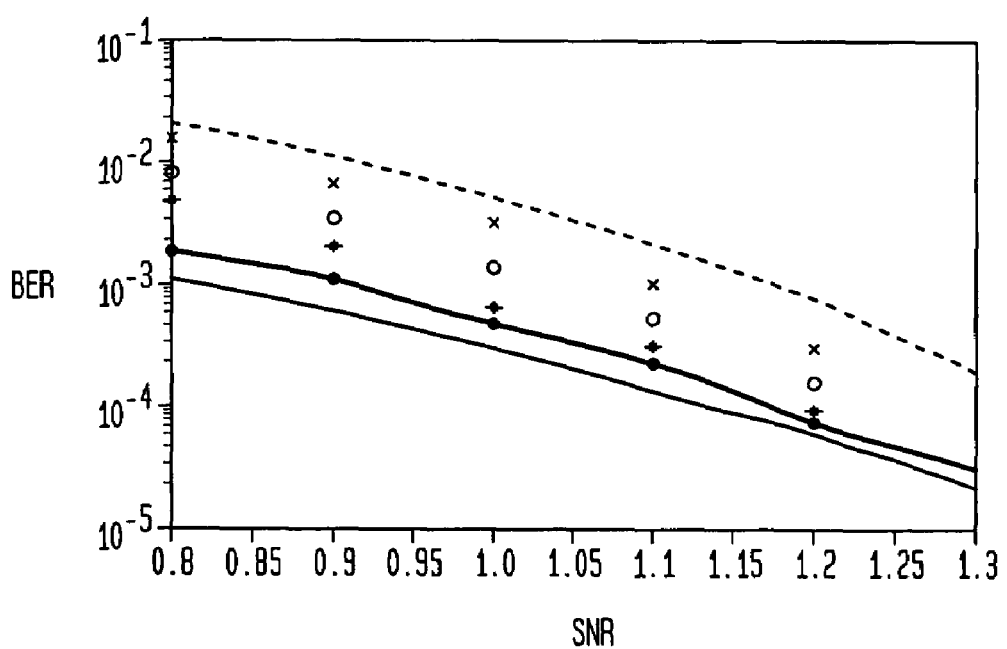
FIG. 3 shows performance as BER versus SNR of max* and max term switching algorithms in accordance with exemplary embodiments of the present invention.

FIG. 3 shows performance of max* and max term switching algorithms in accordance with exemplary embodiments of the present invention as BER versus SNR. The performance of algorithms shown in FIG. 3 was generated by numerical simulation results for UMTS W-CDMA turbo codes with 10 iterations of turbo decoding assuming received output channel samples from an AWGN channel. In FIG. 3, the points plotted as S1 are equivalent to Switch_ITER=1. Similarly, the points plotted as S2, S3, and S4 are equivalent to Switch_ITER=2, Switch_ITER=3 and Switch_ITER=4, respectively. The dashed line plots BER versus SNR for max term-only log-MAP decoding, and the solid line plots BER versus SNR for max* term-only log-MAP decoding. As shown in FIG. 3, the BER performance degradation is negligible (i.e., close to max* term-only log-MAP decoding) if max* term log-MAP decoding occurs for the first 4 iterations, and then switches to max term log MAP decoding. Values for Switch_ITER may be determined using simulation similar to that shown in FIG. 3 and may be adjusted via calibration through measurements over the actual channel. Max* and max term switching algorithms may be implemented in hardware with programmable parameters so that switching may occur at any iteration stage.

Figure 4:
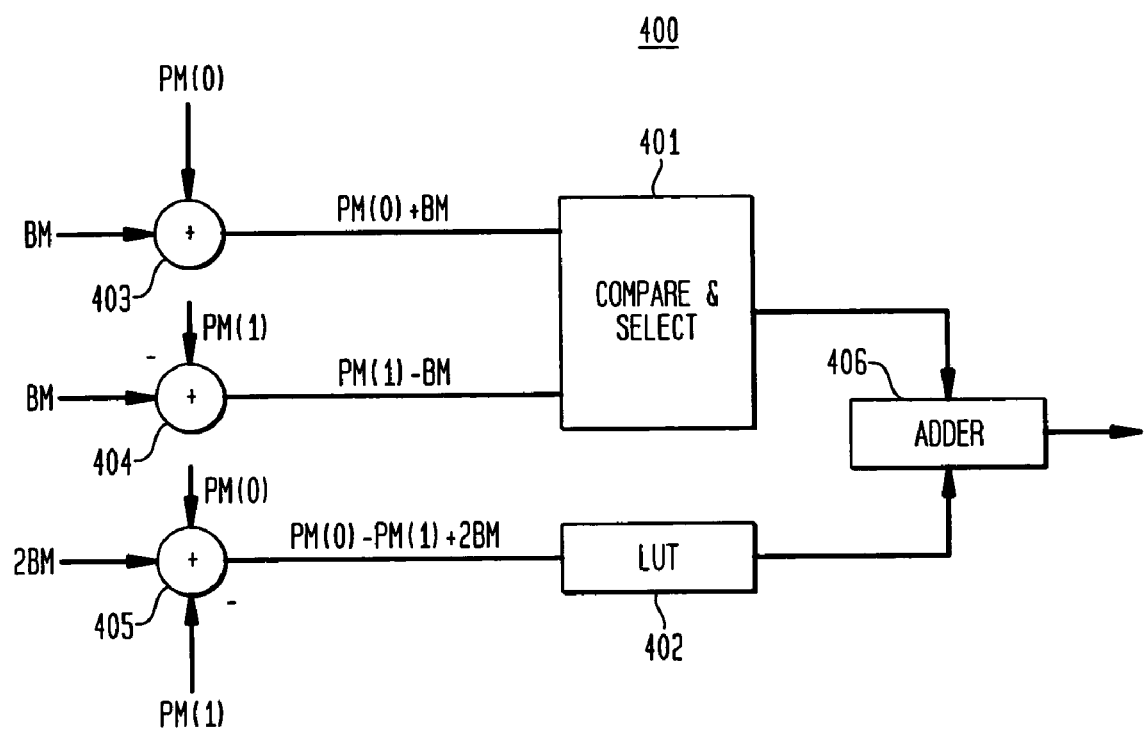
FIG. 4 shows a butterfly structure for an Add-Compare-Select (ACS) circuit that may be employed to implement embodiments of the present invention.

Given the max* and max term switching algorithms, the following describes exemplary circuit hardware implementations including logarithmic correction term bypass. Both max* and max term calculation may be implemented with Add-Compare-Select (ACS) circuitry (with or without correction term) having a butterfly structure well known in the art to reduce complexity of branch metric computation. FIG. 4 shows a butterfly structure 400 that may be employed to implement embodiments of the present invention.

As shown in FIG. 4, the butterfly structure 400 includes compare and select circuit 401, look-up table (LUT) 402, and adders 403–406. To perform a corresponding max* term calculation, path metric memory is accessed to get path metric values PM(0) and PM(1), and current branch metric BM is calculated during the memory access operation. Path metric values PM(0) and PM(1) correspond to either 1) the forward recursive probabilities log($\alpha$) when moving forward through the trellis or 2) backward recursive probabilities log($\beta$) when moving backward through the trellis. BM corresponds to the accumulated branch metric log($\gamma$). Adder 403 generates PM(0)+BM, adder 404 generates PM(1)−BM, and adder 405 generates PM(0)−PM(1)+2BM. Compare and select circuit 401 compares input values PM(0)+BM and PM(1)−BM, and then selects the maximum value of the two input values. The value PM(0)−PM(1)+2BM from adder 405 is employed to address a value in LUT 402 corresponding to the appropriate logarithmic correction term. The logarithmic correction term from LUT 402 is combined with the maximum value selected by compare and select circuit 401 to generate the updated path metric value.

When max term calculation is performed, the lower branch (LUT 402, adder 405, and adder 406) of butterfly structure 400 is not required since the logarithmic correction term is not used. The lower branch may be bypassed by setting the output value of LUT 402 to zero. Alternatively, bypass circuitry may be included in butterfly structure 400, such as shown in FIGS. 5 and 6.

Figure 5:
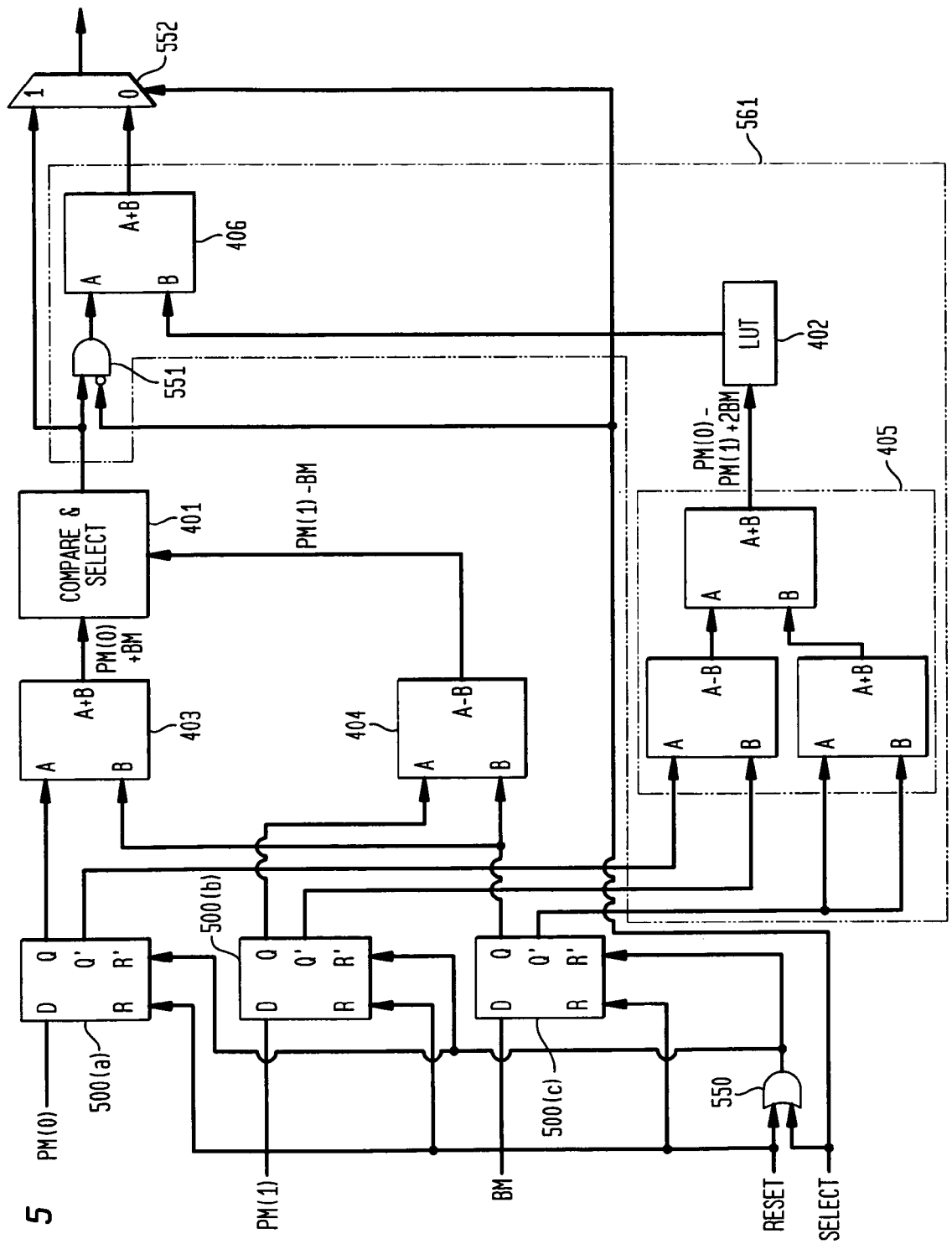
FIG. 5 shows registers in an ACS butterfly structure that implement a bypass scheme for max* and max term switching in accordance with embodiments of the present invention.
Figure 6:
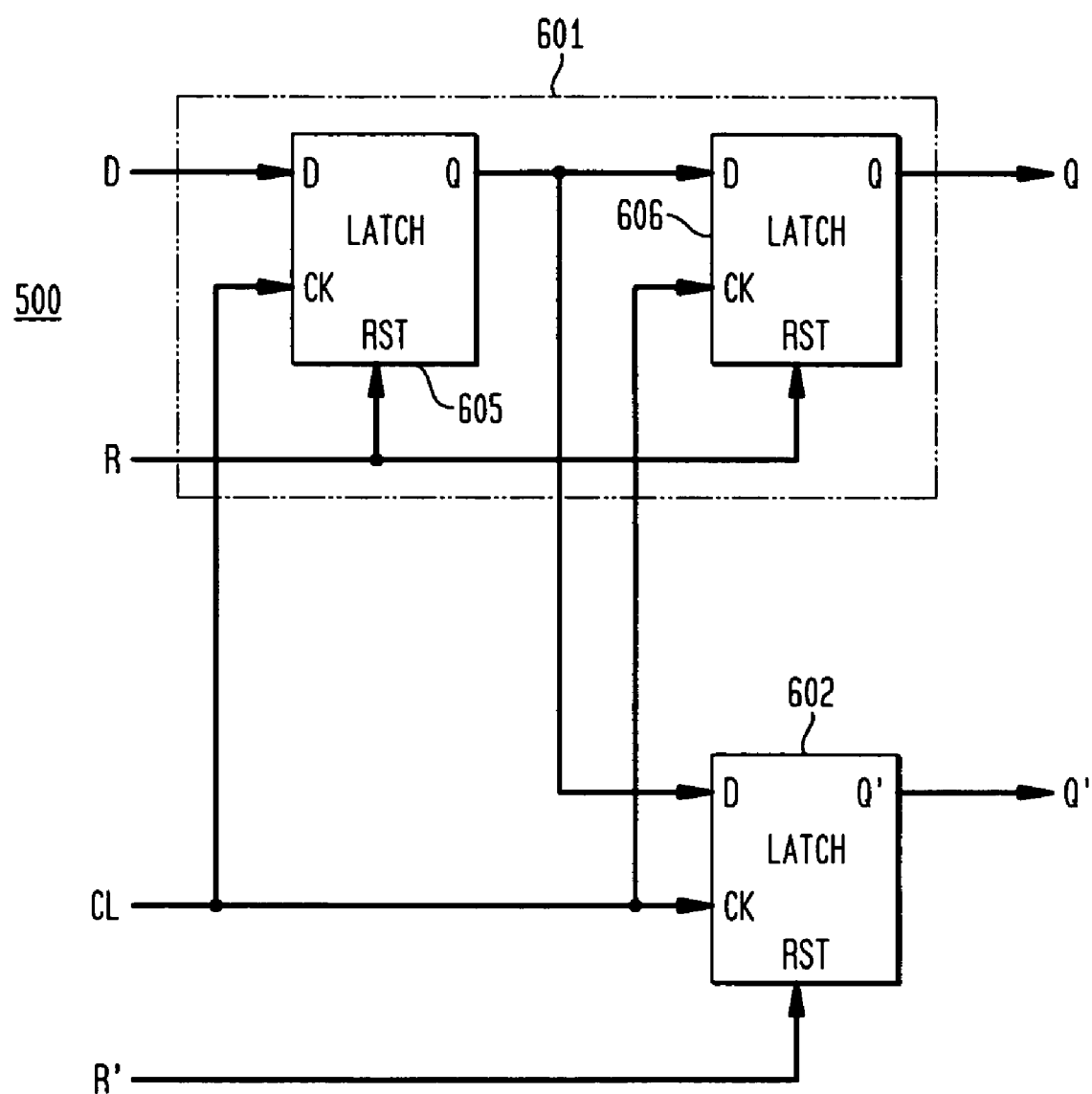
FIG. 6 shows a register including master/slave latch pair and a latch used in the ACS butterfly structure of FIG. 5.

FIG. 5 shows registers 500(*a*), 500(*b*) and 500(*c*) added to ACS butterfly structure 400 (FIG. 4) to support a bypass scheme for max* and max term switching in accordance with embodiments of the present invention. FIG. 6 shows a register 500 including (1) master/slave latch pair 601 having latches 605 and 606, and (2) latch 602. Latch 606 and latch 602 each latch the value of latch 605 to its output port (Q and Q'). The output value of latch 602 may be cleared separately from that of latch 606 via reset signal R' (CL is the system clock signal and D is the input signal to register 500). Latches 602 and 606 allow register 500 to provide two different output values at output ports Q and Q' from register 500 since the port values Q and Q' may be separately cleared.

Returning to FIG. 5, output port Q of registers 500(*a*), 500(*b*), and 500(*c*) provide PM(0), PM(1), and BM, respectively, to adders 403 and 404. Output port Q' of registers 500(*a*), 500(*b*), and 500(*c*) provide PM(0), PM(1), and BM, respectively, to adder 405. During max* term computation, the value of output port Q' corresponds to the value of output port Q in registers 500(*a*), 500(*b*), and 500(*c*). Thus, adder 405 generates the address for LUT 402 to provide the logarithmic correction term. When the value of Switch_ITER is reached, the signal R' (related to the externally generated signal "select" as described subsequently) clears the value of output port Q' in registers 500(*a*), 500(*b*), and 500(*c*), setting the values of PM(0), PM(1), and BM applied to adder 405 to zero. Consequently, the output of adder 405 is set to zero, generating a zero-valued logarithmic correction term from LUT 402.

In addition to generating a zero-valued logarithmic correction term, the lower branch of ACS butterfly structure 400 may be disabled by employing optional OR gate 550, AND gate 551, and mux 552. OR gate 550 receives the latch reset signal R as well as a select signal. The output of OR gate 550 is high when either the reset signal or the select signal is high. The select signal is employed to disable the lower branch and is enabled (set high) when the value of Switch_TER is reached. Once enabled, the select signal appears at the output of OR gate 350 as R', resetting the latch for output value Q' of registers 500(*a*), 500(*b*), and (500(*c*) to zero. In addition, the output signal of compare and select circuit 401 is split and provided to both AND gate 551 and mux 552. AND gate 551 also receives the negation of the select signal. AND gate 551 provides as its the output value the output value of compare and select circuit 401 when the select signal is disabled (i.e., low), and a zero when the select signal is enabled. When select is disabled, adder 406 receives the value of compare and select circuit 401 from AND gate 551 as well as the logarithmic correction term from LUT 402, adds the values, and provides the combined value to mux 552. When select is enabled, adder 406 also receives a zero signal from AND gate 551. When the select signal is disabled, mux selects the output of adder 405 as the output of the ACS butterfly structure. When the select signal is enabled, mux 552 selects the output of compare and select circuit 401 as the output of the ACS butterfly structure.

Max* and max term switching in accordance with exemplary embodiments of the present invention may provide the following advantages. First, reducing the number of computations reduces the power consumption of a given implementation. Second, disabling/bypassing the generation of the logarithmic correction term may allow for faster circuit operation.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. A method of iteratively decoding channel samples to generate decoded data, the method comprising the steps of:
(a) applying at least one maximum a priori (MAP) decoding based on a max* term for one or more initial iterations of decoding, wherein the max* term comprises a max term and a logarithmic correction term; and
(b) switching, for one or more subsequent iterations, to at least one MAP decoding that is based on the max term, wherein, for step (b), the switch is determined based upon an intrinsic signal-to-noise ratio (SNR) of the iterative decoding.

2. The method of claim 1, wherein step (a) includes the step of calculating (i) the max* term as the max term and (ii) the logarithmic correction term.

3. The method of claim 2, wherein the MAP decoding based on the max* term employs the step of addressing a look-up table to provide the logarithmic correction term.

4. The method of claim 1, wherein each iteration generates soft decisions, reliability information, and extrinsic information for a subsequent iteration.

5. The method of claim 4, further comprising the step of, after a predetermined number of iterations, providing the soft decisions of the last iteration as the decoded data.

6. The method of claim 1, wherein, the method is embodied in a receiver operating in accordance with a UMTS CDMA telecommunication standard.

7. The method of claim 1, wherein the method is embodied in a processor of an integrated circuit.

8. The method of claim 1, further comprising the step of determining the intrinsic signal-to-noise ratio (SNR) of the iterative decoding.

9. Apparatus for iteratively decoding channel samples to generate decoded data, the apparatus comprising:
a maximum a priori (MAP) decoder applying at least one MAP decoding based on a max* term for one or more initial iterations of decoding, wherein the MAP decoder comprises:
a first circuit configured to generate the max* term as a max term and a logarithmic correction term; and
a second circuit configured to switch the MAP decoder, for one or more subsequent iterations, to at least one MAP decoding that is based on the max term,
wherein the second circuit switches the MAP decoder based upon an intrinsic signal-to-noise ratio (SNR) of the iterative decoding.

10. The apparatus of claim 9, wherein the first circuit comprises a compare and select circuit configured to generate the max term, a look-up table (LUT) configured to provide the logarithmic correction term when addressed by the first circuit, and a combiner configured to combine the max term and the logarithmic term to generate the max* term.

11. The apparatus of claim 10, wherein the second circuit switches the MAP decoder by disabling a portion of the first circuit providing the logarithmic correction term.

12. The apparatus of claim 9, wherein each iteration generates soft decisions, reliability information, and extrinsic information for a subsequent iteration.

13. The apparatus of claim 12, wherein, after a predetermined number of iterations, the soft decisions of the last iteration are provided as the decoded data.

14. The apparatus of claim 9, wherein, the apparatus is embodied in a receiver operating in accordance with a UMTS CDMA telecommunication standard.

15. The apparatus of claim 9, wherein the apparatus is embodied in an integrated circuit.

16. The apparatus of claim 9, wherein the apparatus is adapted to determine the intrinsic signal-to-noise ratio (SNR) of the iterative decoding.

17. A computer-readable medium having stored thereon a plurality of instructions, the plurality of instructions including instructions which, when executed by a processor, cause the processor to implement a method iteratively decoding channel samples to generate decoded data, the method comprising the steps of:
(a) applying at least one maximum a priori (MAP) decoding based on a max* term for one or more initial iterations of decoding; and
(b) switching, for one or more subsequent iterations, to at least one MAP decoding that is based on a max term, wherein, for step (b), the switch is determined based upon an intrinsic signal-to-noise ratio (SNR) of the iterative decoding.

18. The computer-readable medium of claim 17, wherein the method further comprises the step of determining the intrinsic signal-to-noise ratio (SNR) of the iterative decoding.

19. A method of iteratively decoding channel samples to generate decoded data, the method comprising the steps of:
(a) applying at least one maximum a priori (MAP) decoding based on a max* term for one or more initial iterations of decoding, wherein the max* term comprises a max term and a logarithmic correction term; and
(b) switching, for one or more subsequent iterations, to at least one MAP decoding that is based on the max term, wherein:
the MAP decoding based on the max* term employs the step of addressing a look-up table to provide the logarithmic correction term; and
step (b) switches by enabling a select signal and bypassing, in response to the select signal, the output of the look-up table.

20. The method of claim 19, wherein step (a) includes the step of calculating (i) the max* term as the max term and (i) the logarithmic correction term.

21. A method of iteratively decoding channel samples to generate decoded data, the method comprising the steps of:
(a) applying at least one maximum a priori (MAP) decoding based on a max* term for one or more initial iterations of decoding, wherein the max* term comprises a max term and a logarithmic correction term; and
(b) switching, for one or more subsequent iterations, to at least one MAP decoding that is based on the max term, wherein step (b) switches by the step of setting the logarithmic correction term to a null value.

22. The method of claim 21, wherein step (a) includes the step of calculating (i) the max* term as the max term and (ii) the logarithmic correction term.

23. Apparatus for iteratively decoding channel samples to generate decoded data, the apparatus comprising: a maximum a priori (MAP) decoder applying at least one MAP decoding based on a max* term for one or more initial iterations of decoding, wherein the MAP decoder comprises:
  a first circuit configured to generate the max* term as a max term and a logarithmic correction term; and
  a second circuit configured to switch the MAP decoder for one or more subsequent iterations, to at least one MAP decoding that is based on the max term,
  wherein the second circuit switches the MAP decoder by disabling a portion of the first circuit providing the logarithmic correction term.

24. The apparatus of claim 23, wherein the first circuit comprises:
  a compare and select circuit configured to generate the max term,
  a look-up table (LUT) configured to provide the logarithmic correction term when addressed by the first circuit, and
  a combiner configured to combine the max term and the logarithmic term to generate the max* term.

25. The apparatus of claim 24, wherein:
  the second circuit generates a select signal to disable the portion of the first circuit; and
  the first circuit, in response to the select signal, bypasses the output of the look-up table.

26. Apparatus for iteratively decoding channel samples to generate decoded data, the apparatus comprising:
  a maximum a priori (MAP) decoder applying at least one MAP decoding based on a max* term for one or more initial iterations of decoding, wherein the MAP decoder comprises:
    a first circuit configured to generate the max* term as a max term and a logarithmic correction term; and
    a second circuit configured to switch the MAP decoder for one or more subsequent iterations, to at least one MAP decoding that is based on the max term,
  wherein the second circuit switches the MAP decoder by setting the logarithmic correction term to a null value.

27. The apparatus of claim 26, wherein the first circuit comprises:
  a compare and select circuit configured to generate the max term,
  a look-up table (LUT) configured to provide the logarithmic correction term when addressed by the first circuit, and
  a combiner configured to combine the max term and the logarithmic term to generate the max* term.

* * * * *